(12) United States Patent
Kellerman et al.

(10) Patent No.: US 7,816,153 B2
(45) Date of Patent: Oct. 19, 2010

(54) METHOD AND APPARATUS FOR PRODUCING A DISLOCATION-FREE CRYSTALLINE SHEET

(75) Inventors: Peter L. Kellerman, Essex, MA (US); Frank Sinclair, Quincy, MA (US); Frederick Carlson, Potsdam, NY (US); Nicholas P. T. Bateman, Reading, MA (US); Robert J. Mitchell, Winchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/478,513

(22) Filed: Jun. 4, 2009

(65) Prior Publication Data

US 2009/0302281 A1 Dec. 10, 2009

Related U.S. Application Data

(60) Provisional application No. 61/059,150, filed on Jun. 5, 2008.

(51) Int. Cl.
*H01L 21/00* (2006.01)

(52) U.S. Cl. ............... 438/15; 438/16; 257/E21.001; 257/E21.012; 257/E21.585; 257/E21.586

(58) Field of Classification Search .......... 438/15–19, 438/29–39, 98–112, 484–486; 257/E21.001, 257/121, 141, 585, 586

See application file for complete search history.

(56) References Cited

U.S. PATENT DOCUMENTS

| 3,430,680 A | 3/1969 | Leghorn |
| 3,607,115 A | 9/1971 | Bleil |
| 3,681,033 A | 8/1972 | Blyeil |
| 3,759,671 A | 9/1973 | Bleil |
| 4,121,965 A | 10/1978 | Leipold |
| 4,152,387 A * | 5/1979 | Cloeren ............... 264/173.13 |
| 4,226,834 A | 10/1980 | Shudo et al. |
| 4,264,407 A | 4/1981 | Shudo et al. |
| 4,289,571 A | 9/1981 | Jewett |
| 4,316,764 A | 2/1982 | Kudo et al. |
| 4,322,263 A | 3/1982 | Kudo et al. |
| 4,329,195 A | 5/1982 | Kudo |
| 4,417,944 A | 11/1983 | Jewett |
| 4,428,783 A | 1/1984 | Gessert |
| 4,447,289 A | 5/1984 | Geissler et al. |

(Continued)

FOREIGN PATENT DOCUMENTS

JP 09-099359 * 4/1977

(Continued)

*Primary Examiner*—Michael S Lebentritt

(57) ABSTRACT

A dislocation-free sheet may be formed from a melt. A sheet of material with a first width is formed on a melt of the material using a cooling plate. This sheet has dislocations. The sheet is transported with respect to the cooling plate and the dislocations migrate to an edge of the sheet. The first width of the sheet is increased to a second width by the cooling plate. The sheet does not have dislocations at the second width. The cooling plate may have a shape with two different widths in one instance. The cooling plate may have segments that operate at different temperatures to increase the width of the sheet in another instance. The sheet may be pulled or flowed with respect to the cooling plate.

9 Claims, 7 Drawing Sheets

U.S. PATENT DOCUMENTS

| | | | |
|---|---|---|---|
| 4,555,293 A * | 11/1985 | French | 156/308.4 |
| 4,594,229 A | 6/1986 | Ciszek et al. | |
| 4,599,132 A | 7/1986 | Jewett et al. | |
| 4,873,063 A | 10/1989 | Bleil | |
| 5,055,157 A | 10/1991 | Bleil | |
| 5,069,742 A | 12/1991 | Bleil | |
| 5,229,083 A | 7/1993 | Bleil | |
| 5,273,420 A * | 12/1993 | Gross et al. | 425/382.4 |
| 5,394,825 A | 3/1995 | Schmid et al. | |
| 5,705,111 A * | 1/1998 | Blemberg et al. | 264/173.13 |
| 6,090,199 A | 7/2000 | Wallace, Jr. et al. | |
| 2006/0213589 A1 * | 9/2006 | Sawada et al. | 148/549 |
| 2009/0231597 A1 | 9/2009 | Rowland et al. | |
| 2009/0233396 A1 | 9/2009 | Kellerman et al. | |

FOREIGN PATENT DOCUMENTS

| | | |
|---|---|---|
| JP | 59-008688 A | 1/1984 |
| JP | H03-019326 A | 1/1991 |

* cited by examiner

METHOD AND APPARATUS FOR PRODUCING A DISLOCATION-FREE CRYSTALLINE SHEET

CROSS-REFERENCE TO RELATED APPLICATIONS

This application claims priority to the provisional patent application entitled "Method and Apparatus for Producing a Dislocation-Free Crystalline Silicon Sheet," filed Jun. 5, 2008 and assigned U.S. App. No. 61/059,150, the disclosure of which is hereby incorporated by reference.

FIELD

This invention relates to sheet formation from a melt and, more particularly, to dislocation-free sheet formation from a melt.

BACKGROUND

Silicon wafers or sheets may be used in, for example, the integrated circuit or solar cell industry. Demand for solar cells continues to increase as the demand for renewable energy sources increases. As these demands increase, one goal of the solar cell industry is to lower the cost/power ratio. There are two types of solar cells: silicon and thin film. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 μm thick. To maintain single crystal growth, the boule must be grown slowly, such as less than 10 μm/s, from a crucible containing a melt. The subsequent sawing process leads to approximately 200 μm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology, however, may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries and this lower quality results in lower efficiency solar cells. The sawing process for a polycrystalline silicon ingot is as inefficient as a monocrystalline silicon ingot or boule.

Another solution that may reduce silicon waste is cleaving a wafer from a silicon ingot after ion implantation. For example, hydrogen, helium, or other noble gas ions are implanted beneath the surface of the silicon ingot to form an implanted region. This is followed by a thermal, physical, or chemical treatment to cleave the wafer from the ingot along this implanted region. While cleaving through ion implantation can produce wafers without kerf losses, it has yet to be proven that this method can be employed to produce silicon wafers economically.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 μm.

Horizontal ribbons of silicon that are physically pulled from a melt also have been tested. In one method, a seed attached to a rod is inserted into the melt and the rod and resulting sheet are pulled at a low angle over the edge of the crucible. The angle and surface tension are balanced to prevent the melt from spilling over the crucible. It is difficult, however, to initiate and control such a pulling process. Access must be given to the crucible and melt to insert the seed, which may result in heat loss. Additional heat may be added to the crucible to compensate for this heat loss. This may cause vertical temperature gradients in the melt that may cause non-laminar fluid flow. Also, a possibly difficult angle of inclination adjustment to balance gravity and surface tension of the meniscus formed at the crucible edge must be performed. Furthermore, since heat is being removed at the separation point of the sheet and melt, there is a sudden change between heat being removed as latent heat and heat being removed as sensible heat. This may cause a large temperature gradient along the ribbon at this separation point and may cause dislocations in the crystal. Dislocations and warping may occur due to these temperature gradients along the sheet.

Production of thin sheets separated horizontally from a melt has not been performed. Producing sheets horizontally from a melt by separation may be less expensive than silicon sliced from an ingot and may eliminate kerf loss or loss due to squaring. Sheets produced horizontally from a melt by separation also may be less expensive than silicon cleaved from an ingot using hydrogen ions or other pulled silicon ribbon methods. Furthermore, separating a sheet horizontally from a melt may improve the crystal quality of the sheet compared to pulled ribbons. A crystal growth method such as this that can reduce material costs would be a major enabling step to reduce the cost of silicon solar cells. Yet some data have indicated that these horizontally-produced sheets may still have dislocations in the crystal lattice. Accordingly, there is a need in the art for an improved apparatus and method to produce a dislocation-free sheet from a melt.

SUMMARY

According to a first aspect of the invention, a method of forming a sheet from a melt is provided. The method comprises forming a sheet of a material having a first width on a melt of the material using a cooling plate. The sheet has dislocations. The sheet is transported with respect to the cooling plate whereby the dislocations migrate to an edge of the sheet. The sheet is increased to a second width as the sheet is transported with respect to the cooling plate by changing a parameter of the cooling plate. The second width is larger than the first width and the sheet does not have the dislocations at the second width.

According to a second aspect of the invention, an apparatus for forming a sheet is provided. The apparatus comprises a vessel defining a channel configured to hold a melt of a material. A cooling plate is above the melt having a first section and a second section. The first section has a first width. The second section has a second width larger than the first width.

According to a third aspect of the invention, an apparatus for forming a sheet is provided. The apparatus comprises a vessel defining a channel configured to hold a melt of a material. A cooling plate is above the melt. The cooling plate has a first segment and a plurality of second segments. The plurality of second segments is configured to independently control temperature compared to the first segment.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, or other substrates known to those skilled in the art. Furthermore, while the melt is described herein as being silicon, the melt may contain germanium, silicon and germanium, or other materials known to those skilled in the art. Thus, the invention is not limited to the specific embodiments described below.

Figure 1:
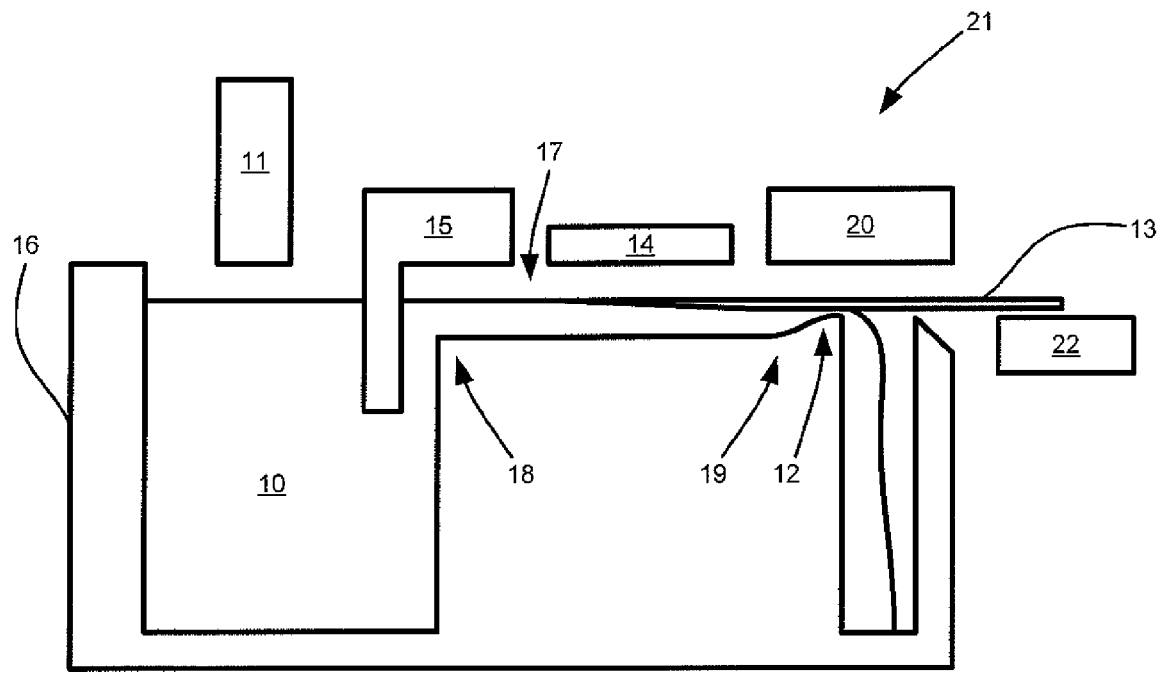
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16 and panels 15 and 20. The vessel 16 and panels 15 and 20 may be, for example, tungsten, boron nitride, aluminum nitride, molybdenum, graphite, silicon carbide, or quartz. The vessel 16 is configured to contain a melt 10. The melt 10 may be silicon. The melt 10 may be replenished through the feed 11 in one embodiment. The feed 11 may contain solid silicon or solid silicon and germanium. The melt 10 may be pumped into the vessel 16 in another embodiment. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. In one instance, only 10% of the sheet 13 protrudes from above the top of the melt 10. The melt 10 may circulate within the apparatus 21.

This vessel 16 defines at least one channel 17. This channel 17 is configured to hold the melt 10 and the melt 10 flows from a first point 18 to a second point 19 of the channel 17. In one instance, the environment within the channel 17 is still to prevent ripples in the melt 10. The melt 10 may flow due to, for example, a pressure difference, gravity, a magnetohydrodynamic drive, a screw pump, and impeller pump, a wheel, or other methods of transport. The melt 10 then flows over the spillway 12. This spillway 12 may be a ramp, a weir, a small dam, or a corner and is not limited to the embodiment illustrated in FIG. 1. The spillway 12 may be any shape that allows a sheet 13 to be separated from the melt 10.

The panel 15 is configured in this particular embodiment to extend in part below the surface of the melt 10. This may prevent waves or ripples from disturbing the sheet 13 as it forms on the melt 10. These waves or ripples may form due to addition of melt material from the feed 11, pumping, or other causes known to those skilled in the art.

In one particular embodiment, the vessel 16 and panels 15 and 20 may be maintained at a temperature slightly above approximately 1687 K. For silicon, 1687 K represents the freezing temperature or interface temperature. By maintaining the temperature of the vessel 16 and panels 15 and 20 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but may include multiple segments or sections in another embodiment. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 and panels 15 and 20 may be any temperature above the melting temperature of the melt 10. This prevents the melt 10 from solidifying on the vessel 16 and panels 15 and 20.

The apparatus 21 may be maintained at a temperature slightly above the freezing temperature of the melt 10 by at least partially or totally enclosing the apparatus 21 within an enclosure. If the enclosure maintains the apparatus 21 at a temperature above the freezing temperature of the melt 10, the need to heat the apparatus 21 may be avoided or reduced and heaters in or around the enclosure may compensate for any heat loss. This enclosure may be isothermal with non-isotropic conductivity. In another particular embodiment, the heaters are not disposed on or in the enclosure and are rather in the apparatus 21. In one instance, different regions of the vessel 16 may be heated to different temperatures by imbedding heaters within the vessel 16 and using multi-zone temperature control.

The enclosure may control the environment where the apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the sheet 13 formation process.

The apparatus 21 includes a cooling plate 14. The cooling plate 14 allows heat extraction as the sheet 13 forms on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of, for example, graphite, quartz, or silicon carbide. The cooling plate 14 may remove heat from the liquid melt 10 quickly, uniformly, and in controlled amounts. Disturbances to the melt 10 may be reduced while the sheet 13 forms to prevent imperfections in the sheet 13.

The heat extraction of the heat of fusion and heat from the melt 10 over the surface of the melt 10 may enable faster production of the sheet 13 compared to other ribbon pulling methods while maintaining a sheet 13 with low defect density. Cooling a sheet 13 on the surface of the melt 10 or a sheet 13 that floats on the melt 10 allows the latent heat of fusion to be removed slowly and over a large area while having a large horizontal flow rate.

The dimensions of the cooling plate 14 may be increased, both in length and width. Increasing the length may allow a faster melt 10 flow rate for the same vertical growth rate and resulting sheet 13 thickness. Increasing the width of the cooling plate 14 may result in a wider sheet 13. Unlike the vertical sheet pulling method, there is no inherent physical limitation on the width of the sheet 13 produced using embodiments of the apparatus and method described in FIG. 1.

In one particular example, the melt 10 and sheet 13 flow at a rate of approximately 1 cm/s. The cooling plate 14 is approximately 20 cm in length and approximately 25 cm in width. A sheet 13 may be grown to approximately 100 μm in thickness in approximately 20 seconds. Thus, the sheet may grow in thickness at a rate of approximately 5 μm/s. A sheet 13 of approximately 100 μm in thickness may be produced at a rate of approximately 10 m$^2$/hour.

Thermal gradients in the melt 10 may be minimized in one embodiment. This may allow the melt 10 flow to be steady and laminar. It also may allow the sheet 13 to be formed via radiation cooling using the cooling plate 14. A temperature difference of approximately 300 K between the cooling plate 14 and the melt 10 may form the sheet 13 on or in the melt 10 at a rate of approximately 7 μm/s in one particular instance.

The region of the channel 17 downstream from the cooling plate 14 and the under the panel 20 may be isothermal. This isothermal region may allow annealing of the sheet 13.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking the crystal in the sheet 13 because no external stress is applied to the sheet 13. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions.

The sheet 13 may be formed faster in the apparatus 21 than by being pulled normal to the melt because the melt 10 may flow at a speed configured to allow for proper cooling and crystallization of the sheet 13 on the melt 10. The sheet 13 will flow approximately as fast as the melt 10 flows. This reduces stress on the sheet 13. Pulling a ribbon normal to a melt is limited in speed because of the stresses placed on the ribbon due to the pulling. The sheet 13 in the apparatus 21 may lack any such pulling stresses in one embodiment. This may increase the quality of the sheet 13 and the production speed of the sheet 13.

The sheet 13 may tend to go straight beyond the spillway 12 in one embodiment. This sheet 13 may be supported after going over the spillway 12 in some instances to prevent breakage. A support device 22 is configured to support the sheet 13. The support device 22 may provide a gas pressure differential to support the sheet 13 using, for example, a gas or air blower. After the sheet 13 is separated from the melt 10, the temperature of the environment where the sheet 13 is located may slowly be changed. In one instance, the temperature is lowered as the sheet 13 moves farther from the spillway 12.

In one instance, the growth of the sheet 13, annealing of the sheet 13, and separation of the sheet 13 from the melt 10 using the spillway 12 may take place in an isothermal environment. The separation using the spillway 12 and the approximately equal flow rates of the sheet 13 and melt 10 minimize stress or mechanical strain on the sheet 13. This increases the possibility of producing a single crystal sheet 13.

In another embodiment, a magnetic field is applied to the melt 10 and sheet 13 in the apparatus 21. This may dampen oscillatory flows within the melt 10 and may improve crystallization of the sheet 13.

Figure 2:
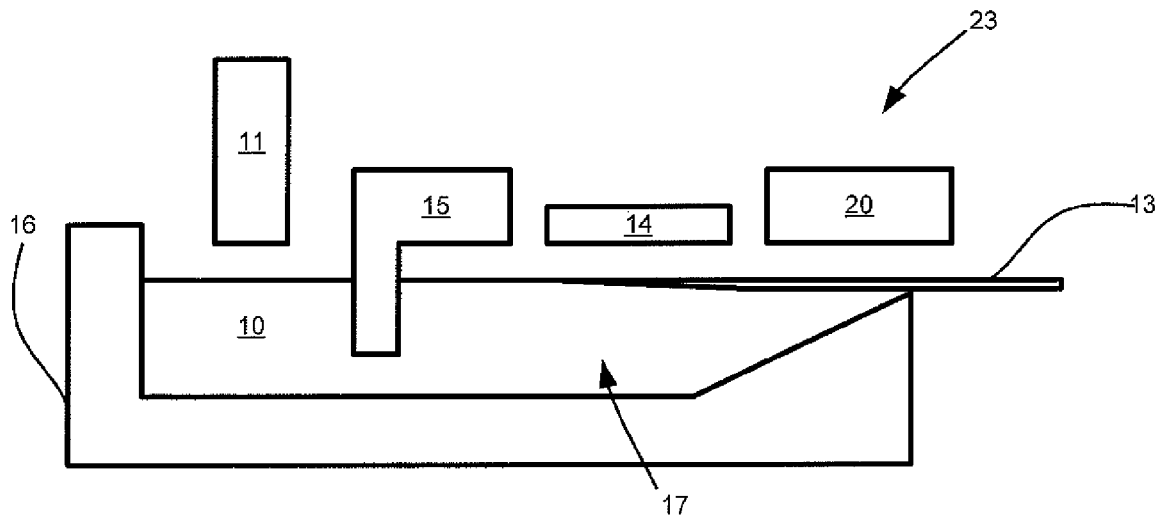
FIG. 2 is a cross-sectional side view of an embodiment of an apparatus that pulls a sheet from a melt.

FIG. 2 is a cross-sectional side view of an embodiment of an apparatus that pulls a sheet from a melt. In this embodiment, the apparatus 23 pulls the sheet 13 from the melt 10. The melt 10 may not be circulating in a channel 17 in this embodiment and the sheet 13 may be pulled using a seed. A sheet 13 may be formed through cooling by the cooling plate 14 and the resulting sheet may be drawn out of the melt 10.

Both the embodiments of FIGS. 1-2 use a cooling plate 14. Different cooling temperatures across the length of the cooling plate 14, different flow rates of the melt 10 or pull speeds of the sheet 13, the length of the various sections of the apparatus 21 or apparatus 23, or the timing within the apparatus 21 or apparatus 23 may be used for process control. If the melt 10 is silicon, a polycrystalline sheet 13 or single crystal sheet 13 may be formed in the apparatus 21. In either the embodiment of FIG. 1 or FIG. 2, the apparatus 21 or apparatus 23 may be contained in an enclosure.

FIG. 1 and FIG. 2 are only two examples of apparatuses that can form sheets 13 in a melt 10. Other apparatuses or methods of horizontal sheet 13 growth are possible. The embodiments of the methods and apparatuses described herein may be applied to any horizontal sheet 13 growth method or apparatus and are not limited solely to the specific embodiments of FIGS. 1-2.

The horizontal sheet 13 may include dislocations in the crystal of the sheet 13. When the sheet 13 is initiated, boundaries between grains form. These dislocations may be a crystallographic defect or irregularity within the crystal structure of the sheet 13 or a lattice mismatch within the sheet 13. Such dislocations are formed in part from the thermal shock caused by the difference in temperature between the sheet 13 and the melt 10. The dislocations will propagate throughout the sheet 13 unless eliminated. To eliminate these dislocations, the dislocations will be allowed to migrate to the edges of the sheet 13. The embodiments described herein may be used to allow formation of single crystal silicon sheets or polycrystalline silicon sheets with increased crystal size that do not have dislocations.

Figure 3:
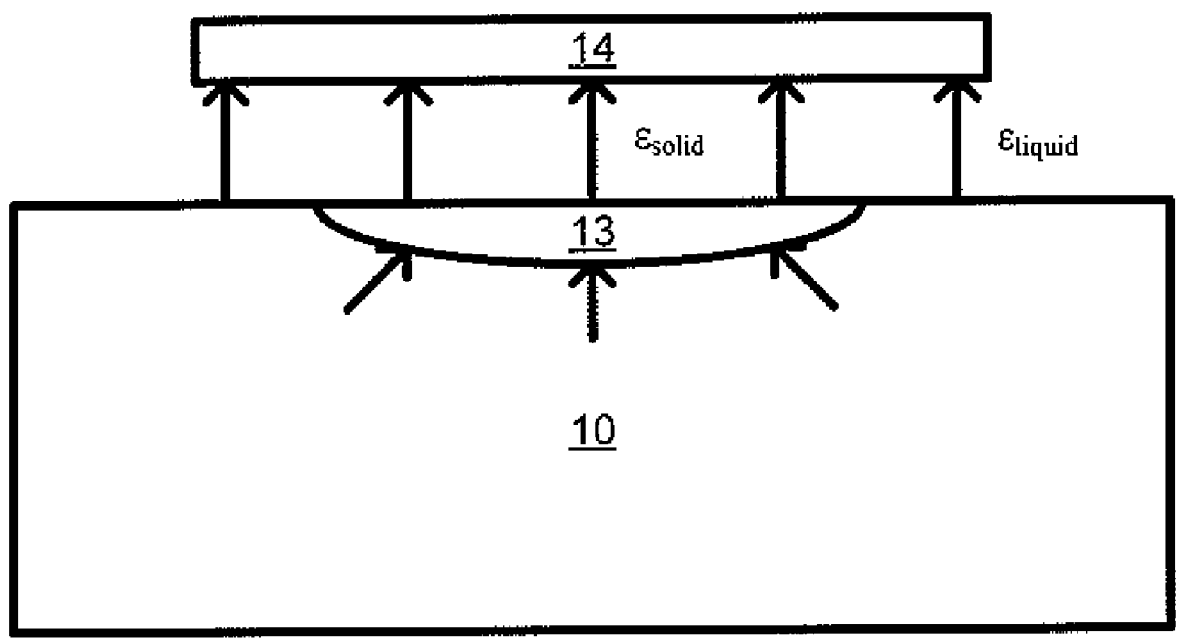
FIG. 3 is a cross-sectional front view of an embodiment of radiative cooling.

FIG. 3 is a cross-sectional front view of an embodiment of radiative cooling. In FIG. 3, the arrows going from the melt 10 to the sheet 13, the melt 10 to the cooling plate 14, and the sheet 13 to the cooling plate 14 represent heat transfer. For radiation at the silicon melting temperature, which is approximately 1700 K, the emissivity of solid silicon ($\epsilon_{solid}$) is approximately three times the emissivity of liquid silicon ($\epsilon_{liquid}$). In this particular embodiment, a cooling plate 14 at a temperature below the freezing temperature of the melt 10 is disposed above the melt 10. In one example, the cooling plate 14 is approximately 10 K below freezing temperature of the melt 10, though other temperature differences are possible. Once a region of the melt 10 begins to crystallize into a sheet 13, the latent heat, or heat liberated during a change of phase at a constant temperature and pressure, will be removed through the solid crystal in the sheet 13 rather than from the liquid melt 10. The crystal in the sheet 13 will, thus, grow stably in the melt 10 because the liquid in the melt 10 will not become super-cooled via direct radiative heat transfer to the cooling plate 14.

In one particular embodiment, convective heat transfer to the cooling plate 14 is avoided. Convective heat transfer may be less efficient than radiative cooling in the atmosphere around the melt 10 and sheet 13. Convective heat transfer may cause waves in the melt 10, and may be difficult to accurately control. In other embodiments, however, convective heat transfer may be used by itself or to supplement radiative heat transfer.

Figure 4:
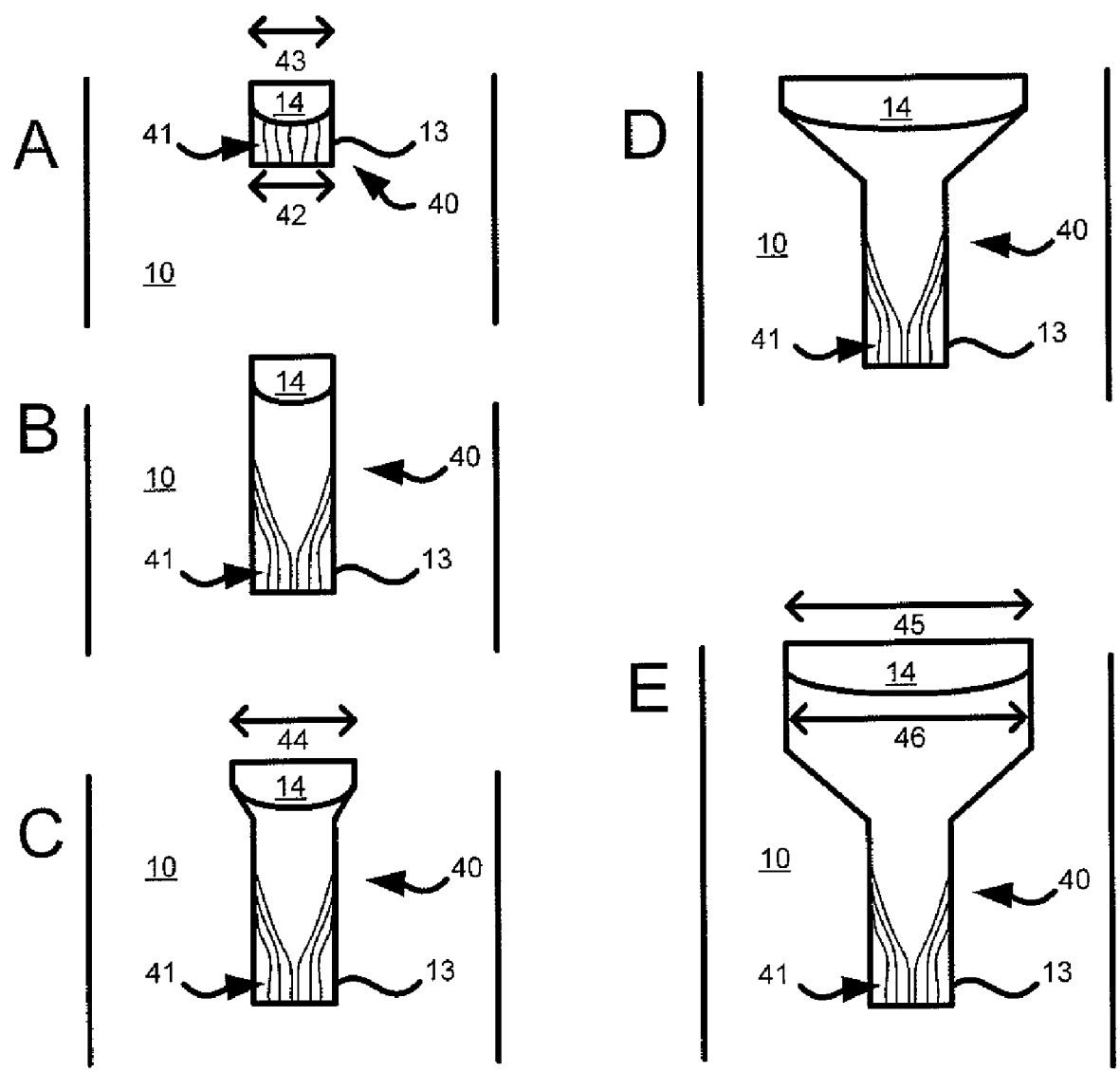
FIGS. 4A-4E are a top plan view of a first embodiment of thread initialization.

FIG. 4 is a top plan view of a first embodiment of thread initialization. FIG. 4 illustrates a process over time from A to E. Thus, the sheet 13 only passes under the cooling plate 14 illustrated in FIGS. 4A-4E once and the cooling plate is only as large as illustrated at the various stages A-E. While the width of the sheet 13 may vary over time, the embodiments disclosed herein may produce a sheet 13 of uniform thickness.

The dislocations 41 may need to be removed prior to steady-state production of the sheet 13. This may begin by using a "necked-down" sheet 13 or a thread 40 of silicon at the beginning of the sheet 13. The thread 40 may be floating on the surface of the melt 10 in this embodiment, as seen in FIG. 3. The thread 40 is transported with respect to the cooling plate 14. This transport may involve pulling the thread 40 or flowing the thread 40 within or with the melt 10. By controlling the size and temperature of the cooling plate 14 and the flow or pull rate of the thread 40, the cross-sectional shape and length of the thread 40 can be configured to allow removal of dislocations 41. By allowing the cooling plate 14 to expand or increase in width or area or the cold region of the cooling plate 14 to expand or increase in width or area and controlling the flow or pull rate of the thread 40, the thread 40 can be expanded to form the sheet 13 of the desired width and thickness.

In FIG. 4A, the initial thread 40 of the sheet 13 in a melt 10 may have dislocations 41. The cooling plate 14, which has a curved edge in this embodiment, has a first width 43 that corresponds to the first width 42 of the thread 40. As the thread 40 flows or is pulled past the cooling plate 14, the dislocations 41 move outward in the thread 40. The dislocations 41 may migrate toward the edge of the thread 40 at least in part due to the shape of the cooling plate 14 in this particular embodiment. The dislocation-free thread 40 occurs prior to the end of FIG. 4B in this embodiment.

In FIG. 4C, the region of the cooling plate 14 below the freezing temperature of the melt 10 begins increasing in dimension. The width 44 is larger than the first width 43. The sheet 13 likewise expands in width past the initial first width 42 of the thread 40. This sheet 13 may be, in one instance, single crystal. In FIG. 4D, the region of the cooling plate 14 below the freezing temperature of the melt 10 continues to increase in dimension while the sheet 13 flows or is pulled with respect to the cooling plate 14.

In FIG. 4E, the region of the cooling plate 14 below the freezing temperature of the melt 10 reaches its second width 45. The sheet 13 likewise has a corresponding second width 46. The second width 45 is larger than the first width 43 of the cooling plate 14 and the second width 46 of the sheet 13 is larger than the first width 42 of the thread 40. The dislocation-free thread 40 has been grown to be a dislocation-free sheet 13. The sheet may be at steady-state with regard to its width in FIG. 4E. The thread 40 or end of the sheet 13 may need to be discarded because it contains dislocations 41.

In another embodiment, the process illustrated in FIGS. 4A-4E includes an extra step. The thread 40 may be further "necked down," or otherwise reduced to an even smaller width from the first width 42, prior to being increased to the second width 46 of the sheet 13. This may allow faster removal of the dislocations 41 because the dislocations will have less distance to travel to the edge of the thread 40.

While the cooling plate 14 of FIGS. 4A-4E is illustrated with a curved edge, the cooling plate 14 may be straight or other shapes known to those skilled in the art. This thread-initialization of FIGS. 4A-4E may be accomplished in multiple ways. Five embodiments are illustrated in FIGS. 5-11, though other implementations are possible. These embodiments use a portion of the cooling plate 14 to initially freeze a thread 40. The region of the cooling plate 14 below the freezing temperature of the melt 10 may expand in time to be wider and then freeze a sheet 13 of desired width. This expansion of the region of the cooling plate 14 below the freezing temperature of the melt 10 is timed to allow the dislocations 41 to migrate out of the thread 40 before expansion to a sheet 13 occurs. These embodiments also may generate a defect and dislocation-free sheet 13 of approximately constant thickness with an approximately rectangular cross-section. While the embodiments of the cooling plates 14 in FIGS. 5-11 have straight edges, the cooling plates 14 may have curved edges or other shapes known to those skilled in the art.

Figure 5:
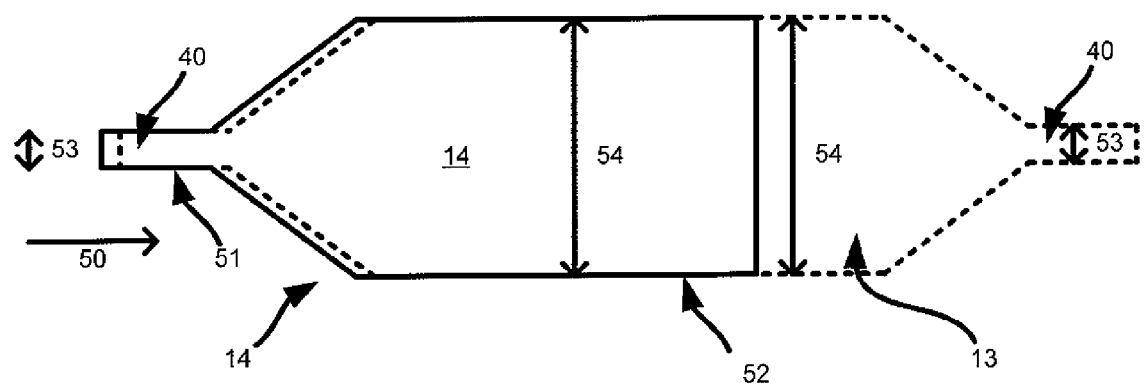
FIG. 5 is a top plan view of a first embodiment of a cooling plate.

FIG. 5 is a top plan view of a first embodiment of a cooling plate. In this embodiment, the sheet 13 and thread 40 are shown under the cooling plate 14 by the dotted line. While the dotted line is shown offset from the outline of the cooling plate 14, the formation of the sheet 13 and thread 40 may be approximately equal to the outline of the cooling plate 14. The thread 40 and sheet 13 flow or are pulled in the direction 50. The cooling plate 14 in this embodiment has a first section 51 and a second section 52. The width 53 of the first section 51 is less than the width 54 of the second section 52. The first section 51 is used to form the thread 40. The second section 52 is used to form the dislocation-free sheet 13. The first section 51 and second section 52 may operate at different temperatures or be activated at different times. Thus, the first section 51 and second section 52 may be two segments in the cooling plate 14 in one embodiment. As the thread 40 or sheet 13 is transported with respect to the cooling plate 14, the temperature of the first section 51 is below the freezing temperature of the melt 10 (as seen in FIG. 3), causing a thread 40 to form having width 53. After dislocations migrate out to the edges of the thread 40, the temperature of the second section 52 is lowered below the freezing temperature of the melt 10 and the width of the thread 40 expands to the width 54 of the second section 52. This will form a sheet 13 with a width 54. The sheet 13 may have a uniform thickness and width after removal of any dislocations in this embodiment.

In one particular embodiment, the cooling plate 14 of FIG. 5 includes different regions besides the first section 51 and second section 52. These regions are at different temperatures. For example, a region down the center of the cooling plate 14 including the first section 51 may operate at a different temperature than the remaining edges of the cooling plate 14. This center region of the cooling plate 14 may operate at a slightly higher temperature than the edges. This will enable equal growth of the sheet 13 and a sheet 13 to exit from under the cooling plate 14 at an approximately equal thickness because the sheet 13 will spend more time under this center region than the remaining edges.

Figure 6:
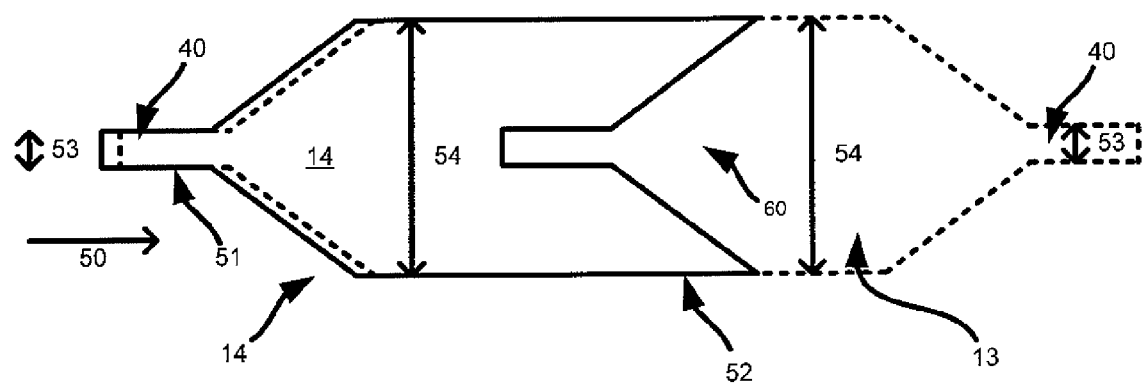
FIG. 6 is a top plan view of a second embodiment of a cooling plate.

FIG. 6 is a top plan view of a second embodiment of a cooling plate. The cooling plate 14 in this particular embodiment defines an indentation 60. This indentation 60 may ensure uniform thickness of the sheet 13. Because the thickness of the sheet 13 is governed by the time and heat transfer rate while under the cooling plate 14 if the cooling plate 14 operates at an even temperature in all regions, the indentation 60 reduces the amount of time the sheet 13 spends under the second section 52 to compensate for the time the thread 40 spends under the first section 51. This equalizes total heat removal from all parts or regions of said sheet 13.

Figure 7:
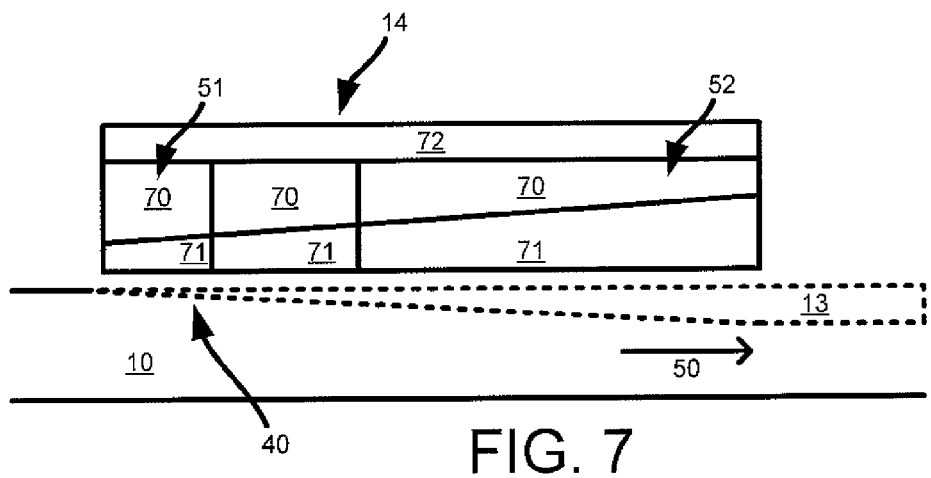
FIG. 7 is a side cross-sectional view of a third embodiment of a cooling plate.

FIG. 7 is a side cross-sectional view of a third embodiment of a cooling plate. The cooling plate 14 in FIG. 7 may correspond with the cooling plates 14 of FIGS. 5-6. The cooling plate 14 of FIG. 7 includes a high thermal diffusivity layer 70 and a low thermal diffusivity layer 71. The high thermal diffusivity layer 70 and low thermal diffusivity layer 71 are composed of materials with different thermal diffusivities. The high thermal diffusivity layer 70 and low thermal diffusivity layer 71 vary in thickness and may control the temperature profile and radiation cooling of the melt 10 over time. The high thermal diffusivity layer 70 may be disposed on a cold surface 72. If the top surface of the cooling plate 14 is lowered to below the freezing temperature of the melt 10 by the cold surface 72, the transient effect of the different regions of thermal diffusivity causes the first section 51 to become cold before the second section 52. Thus, the first section 51 is lowered in temperature, the thread 40 is formed, the second section 52 is lowered in temperature, and the sheet 13 is formed. This enables the thread 40 creation, removal of any dislocations, and expansion to a sheet 13. Anisotropy of the layers 70, 71 of the cooling plate 14 may be configured to enhance cooling in one embodiment. The cold surface 72 may be activated to operate below the melting temperature of the melt 10 through fluid flow, gas conduction, coolant, or other methods known to those skilled in the art. Other shapes or configurations of the high thermal diffusivity layer 70 and low thermal diffusivity layer 71 than illustrated in FIG. 7 are possible.

Figure 8:
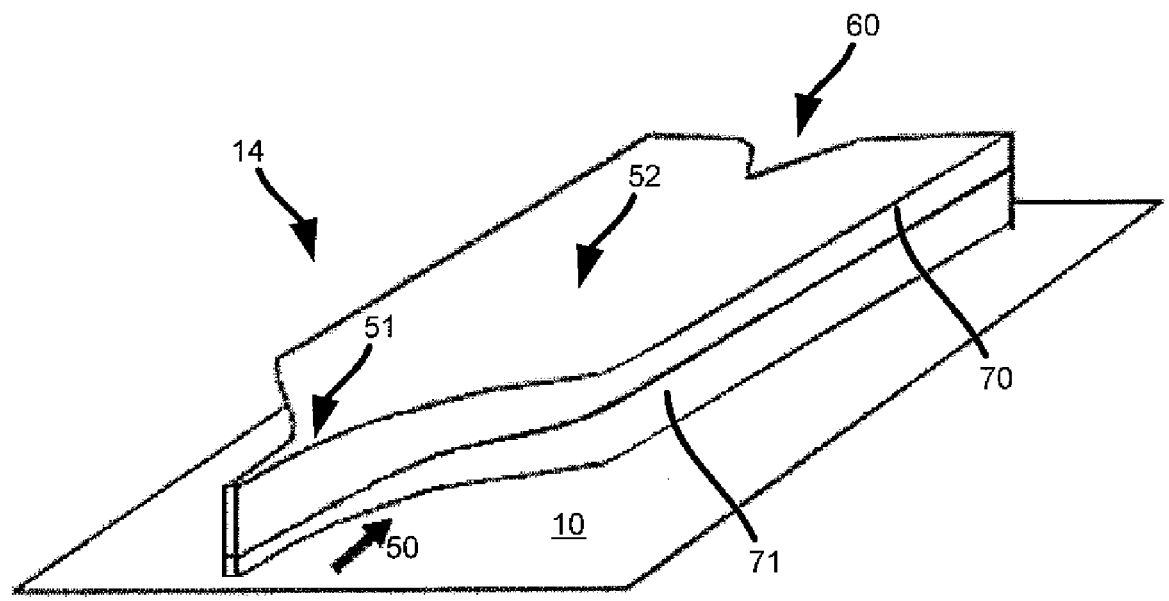
FIG. 8 is a perspective view of a fourth embodiment of a cooling plate.

FIG. 8 is a perspective view of a fourth embodiment of a cooling plate. This cooling plate 14 includes a first section 51, second section 52, and defines an indentation 60. This cooling plate 14 also has a high thermal diffusivity layer 70 and a low thermal diffusivity layer 71. The thickness of each layer 70, 71 may vary in the width and length directions.

In another embodiment, the edges of the cooling plate 14 in FIGS. 5-8 are heated to provide control of the shape of the thread 40 or sheet 13 at these edges. In yet another embodiment, the pressure may be different in the regions surrounding different areas of the cooling plate 14. This pressure difference affects advection and conduction within a gas and its thermal resistance.

Figure 9:
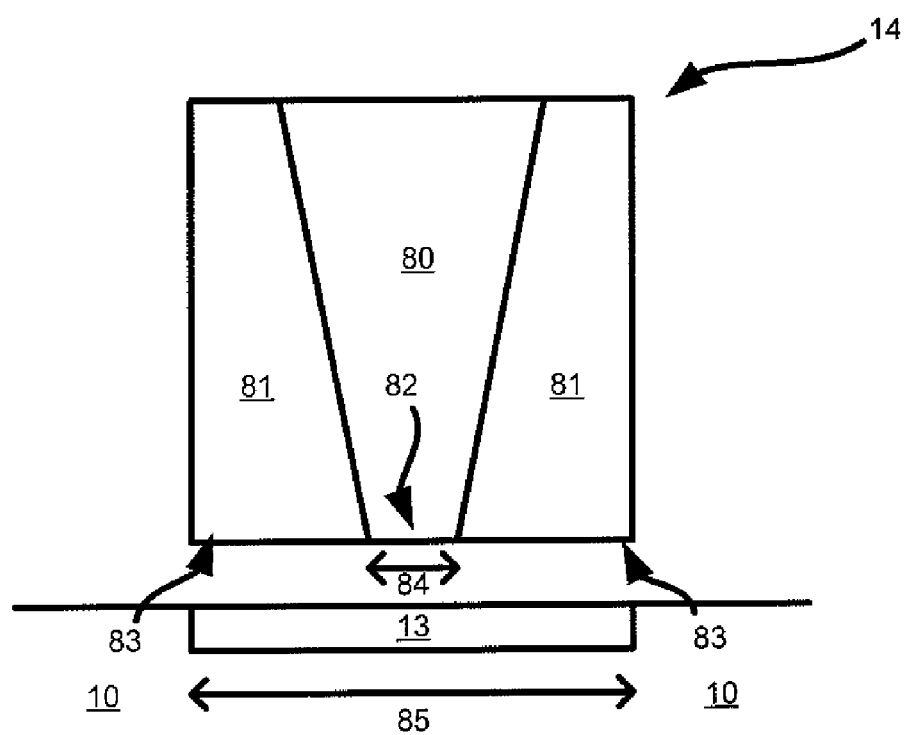
FIG. 9 is a front cross-sectional view of a fifth embodiment of a cooling plate.

FIG. 9 is a front cross-sectional view of a fifth embodiment of a cooling plate. The cooling plate 14 has a first segment 80 and two second segments 81. While two second segments 81 are illustrated, more or fewer second segments 81 are possible and this embodiment is not limited solely to two second segments 81. The second segments 81 are not rectangles in this embodiment, but may be rectangular or other shapes. The bottom surface 82 of the first segment 80 has a first width 84. The first segment 80 is configured to operate at a first temperature. This first temperature is below the freezing temperature of the melt 10. The second segments 81 are configured to operate at a temperature independently of the first segment 80. The second segments 81 each have a bottom surface 83. Both the first segment 80 and second segments 81 may be activated in one instance.

Figure 10:
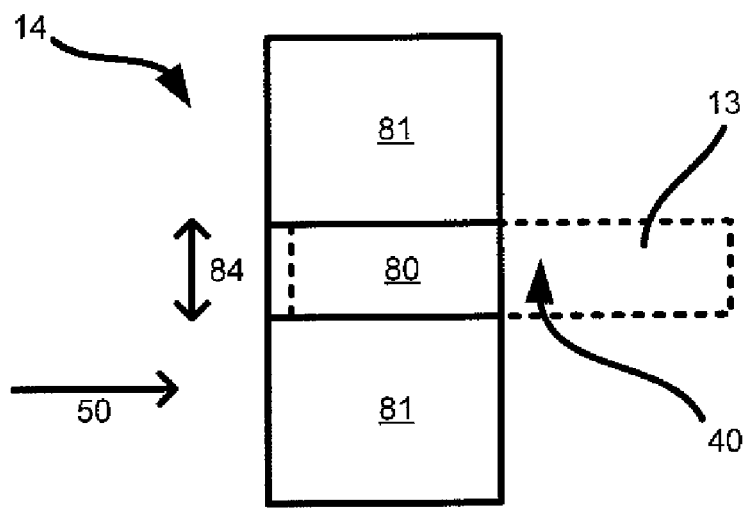
FIG. 10 is a top cross-sectional view of the fifth embodiment of a cooling plate.

In a first phase, the first segment 80 operates at a temperature below the freezing temperature of the melt 10. This forms a thread 40 of the first width 84 in the melt 10, as illustrated in FIG. 10. The thread 40 may be pulled or flowed with respect to the first segment 80. While the thread 40 is forming, the second segments 81 operate at a temperature above the freezing temperature of the melt 10 to allow a single crystal thread 40 or seed to be formed. In one specific embodiment, the second segments 81 are not yet activated when these are above the freezing temperature of the melt 10. In another specific embodiment, the second segments 81 are activated, but operate at a temperature above the melting temperature of the melt 10.

In a second phase, the second segments 81 operate at a lower temperature than in the first phase. In one particular embodiment, the second segments 81 operate at approximately the same temperature as the first segment 80. This temperature may be below the melting temperature of the melt 10. This will present a cooling plate 14 with an operational width 85. The operational width 85 is the width of the bottom surfaces 82, 83. Thus, the sheet 13 will be formed with a width approximately equal to the operational width 85.

In one embodiment, the segments 80, 81 may both operate at one temperature but the second segments 81 include heaters to independently vary the temperature of the second segments 81. In another instance, fluid flow to the segments 80, 81 may be individually modified to change the temperature of each.

FIG. 10 is a top cross-sectional view of the fifth embodiment of a cooling plate. In FIG. 10, the first phase is illustrated. The second segments 81 are operating at a temperature higher than the first segment 80. The first segment 80 is operating at a temperature below the freezing temperature of the melt 10 while the second segments 81 are above the freezing temperature of the melt 10. This forms the thread 40 that is illustrated by the dotted line. The size and thickness of each segment 80, 81 may vary in the width and length directions. In the second phase, the second segments 81 operate at approximately the same temperature as the first segment 80 and the width of the thread 40 will increase.

Figure 11:
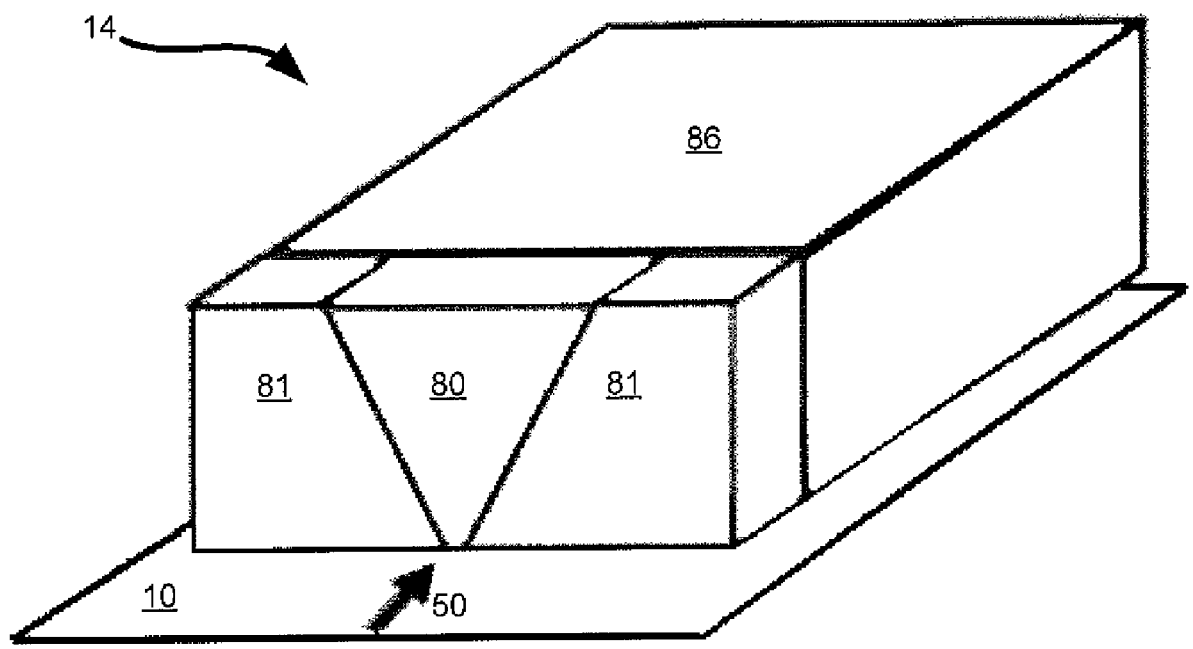
FIG. 11 is a perspective view of the fifth embodiment of a cooling plate.

FIG. 11 is a perspective view of the fifth embodiment of a cooling plate. The first segment 80 and second segments 81 are disposed in front of a third segment 86 in this particular embodiment. The third segment 86 may operate at the same temperature as the first segment 80. The third segment 86 may be activated and operate similar to the second segments 81 in one embodiment. Radiation shields may be located around the segments 80, 81, 86 or around the cooling plate 14 in one particular embodiment.

In one embodiment, the segments 80, 81, 86 may all operate at one temperature but the segments 81, 86 include heaters to independently vary the temperature of these segments 81, 86. In another instance, fluid flow to the segments 80, 81, 86 may be individually modified to change the temperature of each.

Figure 12:
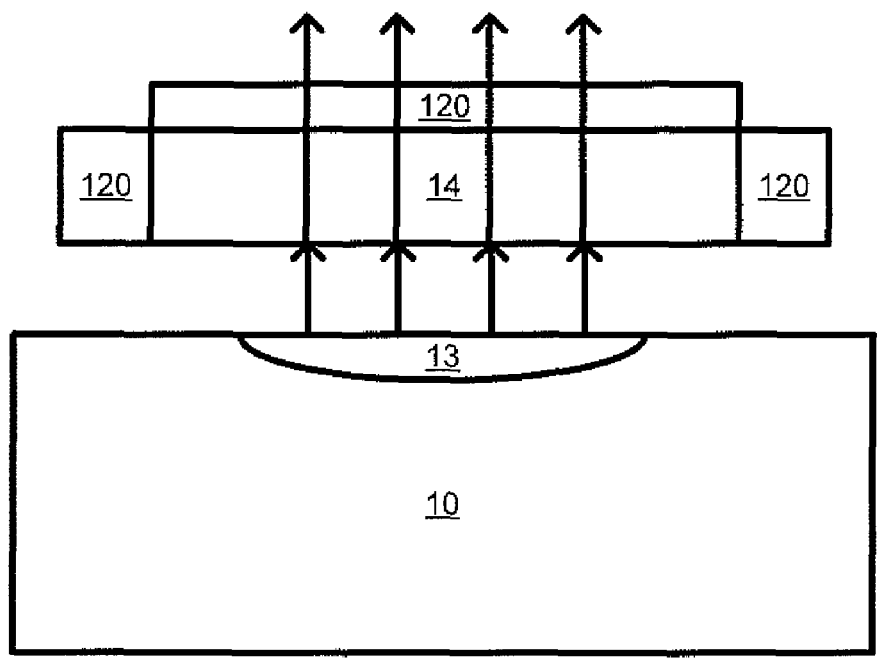
FIG. 12 is a front cross-sectional view of pressure control for a cooling plate.

FIG. 12 is a front cross-sectional view of pressure control for a cooling plate. The embodiments of FIGS. 5-11 may use pressure control to control heat flux from the cooling plate 14 to the cold surroundings. In FIG. 12, the arrows going from the sheet 13 to the cooling plate 14 and out of the cooling plate 14 represent heat transfer. To control the heat flux using pressure, a radiation shield assembly 120 may be placed around the cooling plate 14 on, for example, the surfaces of the cooling plate 14 not facing the melt 10. Each radiation shield assembly 120 illustrated in FIG. 12 may contain multiple individual shields separated from one another. Heat transfer between the shields is radiative and conductive. A gas conduction element may be configured so that gas conduction remains in the molecular-free regime such that the rate of heat transfer by conduction is proportional to pressure. This enables a range of heat transfer that allows control of a power density from, for example, less than 1 kW/m$^2$ to greater than 10 kW/m$^2$. Power densities outside this particular range also are possible. Maintaining the gas in the molecular-free regime is accomplished by changing gas pressure and inserting a sufficient number of shields in the radiation shield assembly 120 so as to keep the gap between shields less than the mean-free path of the gas molecules. The effective resistance of the radiation shield assembly 120 also may allow heat flow. The effective resistance of the radiation shield assembly 120 also may be used to control heat transfer by varying the number of shields within the radiation shield assembly 120. For example, 50 shields may be stacked with approximately 1.5 μm gaps and the pressure may be varied between approximately 1 and 20 Torr.

Figure 13:
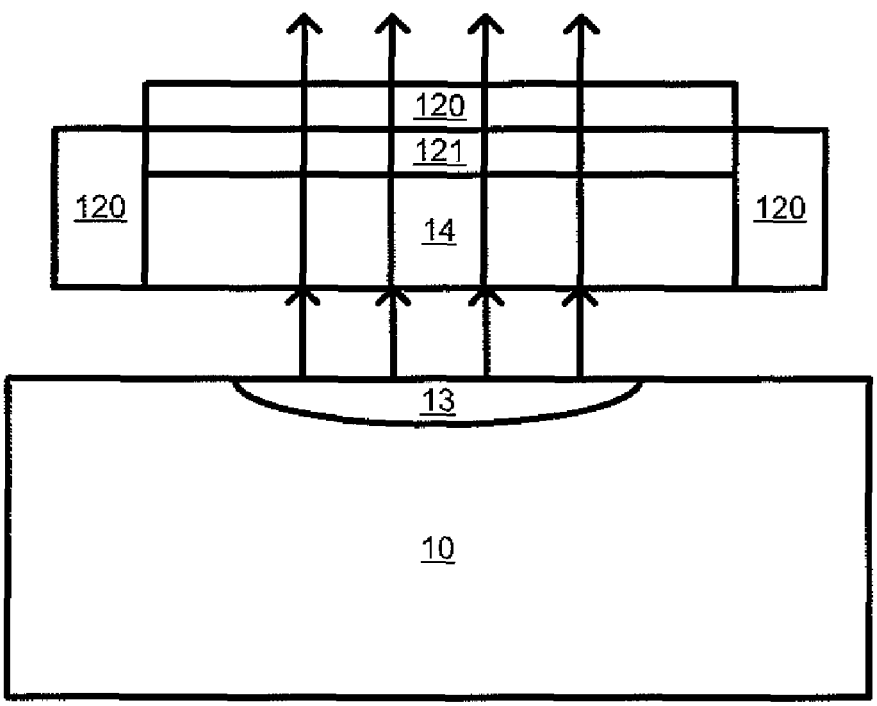
FIG. 13 is a front cross-sectional view of heater balance for a cooling plate.

FIG. 13 is a front cross-sectional view of heater balance for a cooling plate. The embodiments of FIGS. 5-11 may use heater balance to control heat flux from the cooling plate 14 to the surroundings. In FIG. 13, the arrows going from the sheet 13 to the cooling plate 14 and out of the cooling plate 14 represent heat transfer. Heater balance may compensate for a steady energy loss through an insulator using an additional heater 121. Radiation shield assemblies 120 are disposed around the cooling plate 14 in this particular embodiment. Each radiation shield assembly 120 illustrated in FIG. 13 may contain multiple individual shields separated from one another. In this embodiment, heat transfer is by radiation and conduction in the absence of fluid motion. Conduction resistance can be controlled by gas pressure. Radiation resistance can be controlled by number of shields in the radiation shield assemblies 120 and the respective emissivity of each.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a sheet from a melt comprising:
   forming a sheet of a material having a first width on a melt of said material using a cooling plate, said sheet having dislocations;
   transporting said sheet with respect to said cooling plate whereby said dislocations migrate to an edge of said sheet;
   increasing said sheet to a second width as said sheet is transported with respect to said cooling plate by changing a parameter of said cooling plate, said second width being larger than said first width, said sheet not having said dislocations at said second width.

2. The method of claim 1, wherein said transporting comprising flowing said melt.

3. The method of claim 1, wherein said transporting comprises pulling said sheet with respect to said melt.

4. The method of claim 1, wherein said sheet and said melt are comprised of silicon or silicon and germanium.

5. The method of claim 1, wherein said forming comprises radiative cooling.

6. The method of claim 1, wherein said cooling plate is at least 10 K colder than said melt.

7. The method of claim 1, wherein said parameter is a width of said cooling plate at a temperature below a melting temperature of said melt.

8. The method of claim 1, further comprising transporting said sheet at said second width with respect to said cooling plate, said sheet having a uniform thickness at said second width.

9. A product formed using the method of claim 1.

* * * * *